United States Patent
Lawson

(10) Patent No.: US 9,621,108 B2
(45) Date of Patent: Apr. 11, 2017

(54) FLYBACK AMPLIFIER WITH DIRECT FEEDBACK

(71) Applicant: CogniPower, LLC, Malvern, PA (US)

(72) Inventor: Thomas E. Lawson, Malvern, PA (US)

(73) Assignee: CogniPower, LLC, Malvern, PA (US)

( * ) Notice: Subject to any disclaimer, the term of this patent is extended or adjusted under 35 U.S.C. 154(b) by 0 days.

(21) Appl. No.: 14/381,320

(22) PCT Filed: Jan. 13, 2014

(86) PCT No.: PCT/US2014/011206
§ 371 (c)(1),
(2) Date: Aug. 27, 2014

(87) PCT Pub. No.: WO2014/110474
PCT Pub. Date: Jul. 17, 2014

(65) Prior Publication Data
US 2015/0311865 A1    Oct. 29, 2015

Related U.S. Application Data

(60) Provisional application No. 61/751,996, filed on Jan. 14, 2013.

(51) Int. Cl.
*H03F 3/217*    (2006.01)
*H03F 1/02*    (2006.01)
(Continued)

(52) U.S. Cl.
CPC ...... *H03F 1/0205* (2013.01); *H02M 3/33569* (2013.01); *H03F 3/211* (2013.01); *H03F 3/217* (2013.01); *H03F 2200/301* (2013.01)

(58) Field of Classification Search
CPC .. H03F 1/0205; H03F 3/217; H03F 2200/301; H03F 3/211; H02M 3/33569
(Continued)

(56) References Cited

U.S. PATENT DOCUMENTS 6,069,804 A * 5/2000 Ingman ................ H02J 7/0068
363/124
6,606,257 B2 * 8/2003 Bourdillon ........ H02M 3/33561
363/131
(Continued)

FOREIGN PATENT DOCUMENTS

WO    WO2008024529 A2    2/2008
WO    WO2011097152 A1    8/2011

OTHER PUBLICATIONS

B. Krishnamachari, D. Czarkowski, "Bidirectional buck-boost converter with variable output voltage", Circuits and Systems, 1998. ISCAS '98. Proceedings of the 1998 IEEE International Symposium on Year: 1998, vol. 6, pp. 446-449.*
(Continued)

*Primary Examiner* — Steven J Mottola
*Assistant Examiner* — Hafizur Rahman
(74) *Attorney, Agent, or Firm* — Mendelsohn Dunleavy, P.C.; Steve Mendelsohn

(57) ABSTRACT

In at least one embodiment, the invention provides a bidirectional amplifier and method of control that enables immediate feedback directly from the output for fast response and low distortion. Mechanisms responsive to instantaneous feedback eliminate undershoot, overshoot, and sub-harmonic behavior. One embodiment comprises two switches and a single two-terminal inductor. Another embodiment produces a bipolar output from a single unregulated supply rail. The use of Predictive Energy Balancing controls yield high efficiency and low total harmonic distortion. These amplifiers are suited for audio application, and can drive piezo or dynamic speakers.

20 Claims, 11 Drawing Sheets

(51) Int. Cl.
*H02M 3/335* (2006.01)
*H03F 3/21* (2006.01)

(58) Field of Classification Search
USPC ........ 323/266–268; 363/21.04, 21.06, 21.09,
363/21.1, 21.12, 21.14, 21.17, 21.18, 65,
363/86, 97; 381/120, 121; 330/251, 260
See application file for complete search history.

(56) References Cited

U.S. PATENT DOCUMENTS

| | | | |
|---|---|---|---|
| 6,717,388 B2* | 4/2004 | Smidt | H02M 3/33584 |
| | | | 323/222 |
| 6,894,461 B1 | 5/2005 | Hack et al. | |
| 7,315,151 B2* | 1/2008 | Thompson | G05F 1/613 |
| | | | 323/223 |
| 8,345,452 B2 | 1/2013 | Alexander | |
| 2008/0055940 A1 | 3/2008 | Lawson et al. | |
| 2011/0032034 A1 | 2/2011 | Jurzitza | |

OTHER PUBLICATIONS

International Preliminary Report on Patentability; Mailed May 13, 2014 for the corresponding PCT Application No. PCT/US14/11206.
European Search Report; Mailed Sep. 27, 2016 for EP Application No. EP14737679.2.

\* cited by examiner

FLYBACK AMPLIFIER WITH DIRECT FEEDBACK

CROSS-REFERENCE TO RELATED APPLICATIONS

This application claims the benefit of the filing date of U.S. provisional application No. 61/751,996, filed on Jan. 14, 2013, the teachings of which are incorporated herein by reference in their entirety.

BACKGROUND

Field of the Invention

The present invention is related to electronics and, in particular, to flyback amplifiers.

Description of the Related Art

Switched-mode amplifiers in the prior art can apply feedback from the output to adjust a switching duty cycle. That duty cycle is filtered by the switched inductive element to produce an output voltage. The filter delay is then necessarily inside the feedback loop, causing the well-known need for amplifier compensation.

DETAILED DESCRIPTION OF THE DRAWINGS

Certain embodiments of the present invention involve techniques that employ direct feedback to eliminate the need for loop compensation.

Figure 1:
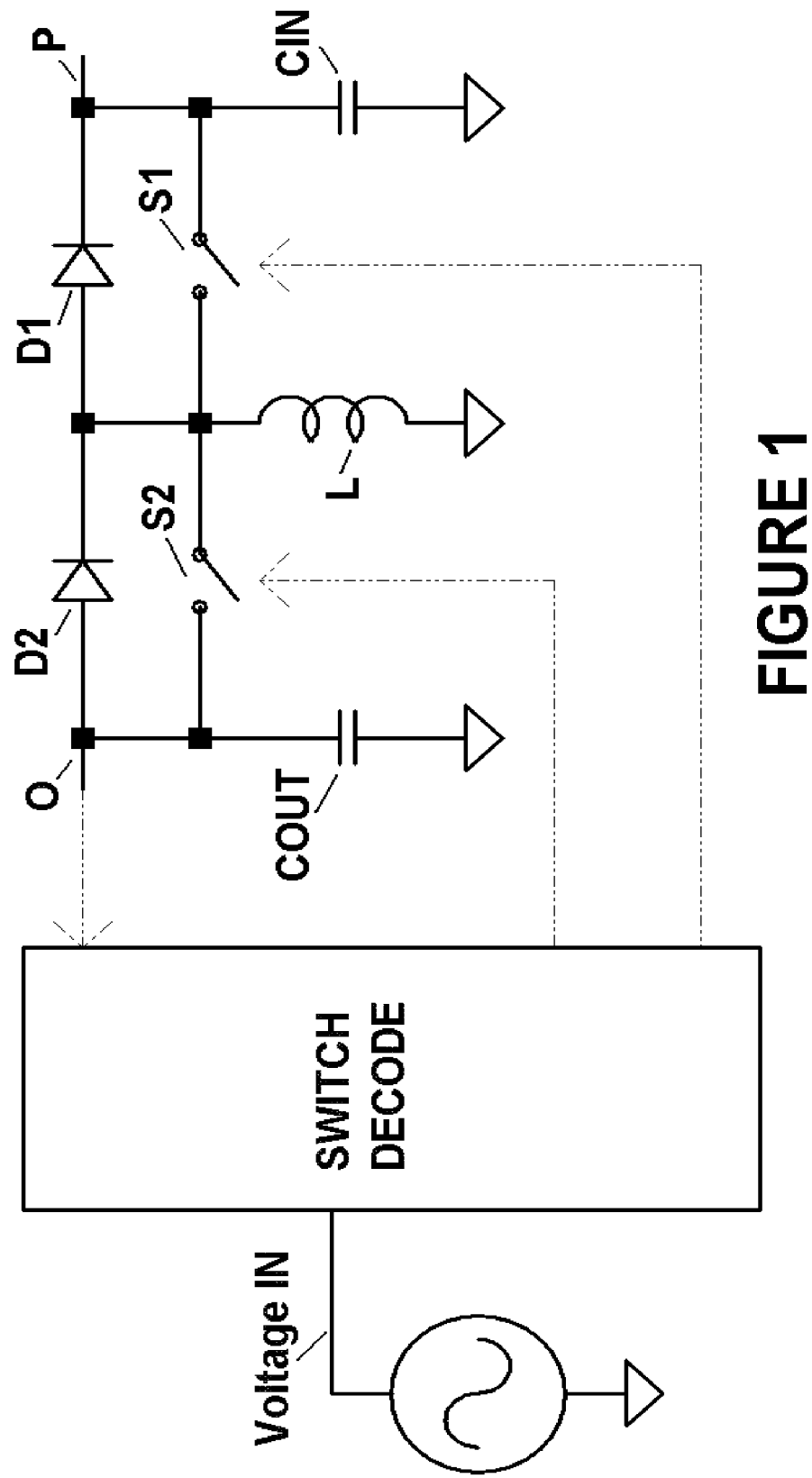
FIG. 1 shows an inverting, bidirectional, flyback amplifier.

The amplifier of FIG. 1 is an inverting bidirectional flyback amplifier. Two unipolar-blocking switches, S1 and S2, preferably FETs, are connected in series between the power input, P, and the signal output, O. Their junction also connects to a two-terminal inductor, L, the other end of which connects to common. The intrinsic body diodes of the two switches are shown explicitly as D1 and D2. Discrete diodes could alternatively be used. The power input, P, has associated capacitance, CIN, which might or might not be a discrete component. The power output, O, also has associated capacitance, COUT, which might or might not be a discrete component. For example, COUT may comprise a piezo speaker, which behaves substantially like a capacitor.

A switch control block, SWITCH DECODE, responds to a signal input, Voltage IN, and to the output voltage, O, to operate the two switches, S1 & S2. Operation can be synchronous or asynchronous.

There are two types of energy moving cycles. If, based on Voltage IN, the output voltage is to be increased in magnitude, then switch S1 is closed until a desired amount of energy has been placed in inductor, L. Then, switch S1 opens, causing flyback energy to pass through diode D2 to increase the magnitude of the output. This type of energy cycle is here defined as a Forward cycle. If, based on Voltage IN, the output is to be decreased in magnitude, then switch S2 is closed until the output voltage substantially equals the desired voltage. Then, switch S2 opens, causing flyback energy to pass through diode D1 to return the energy to the input. This type of energy cycle is here defined as a Reverse cycle. Both Forward and Reverse cycles begin with an Energize period, followed by a Transfer period.

The output voltage, O, can be larger or smaller in magnitude than or equal to the power input voltage, P, but of opposite polarity. The amplifier of FIG. 1 has a positive power input and a negative output. By reversing the polarity of diodes D1 and D2, the polarities of the input and output can be reversed. In either case, the Output, O, is caused to track an inversion of the input, Voltage IN, through the selective application of Forward and Reverse energy cycles. Switches S1 and S2 may be operated to provide synchronous rectification during periods when their parallel diodes are conducting.

Figure 2:
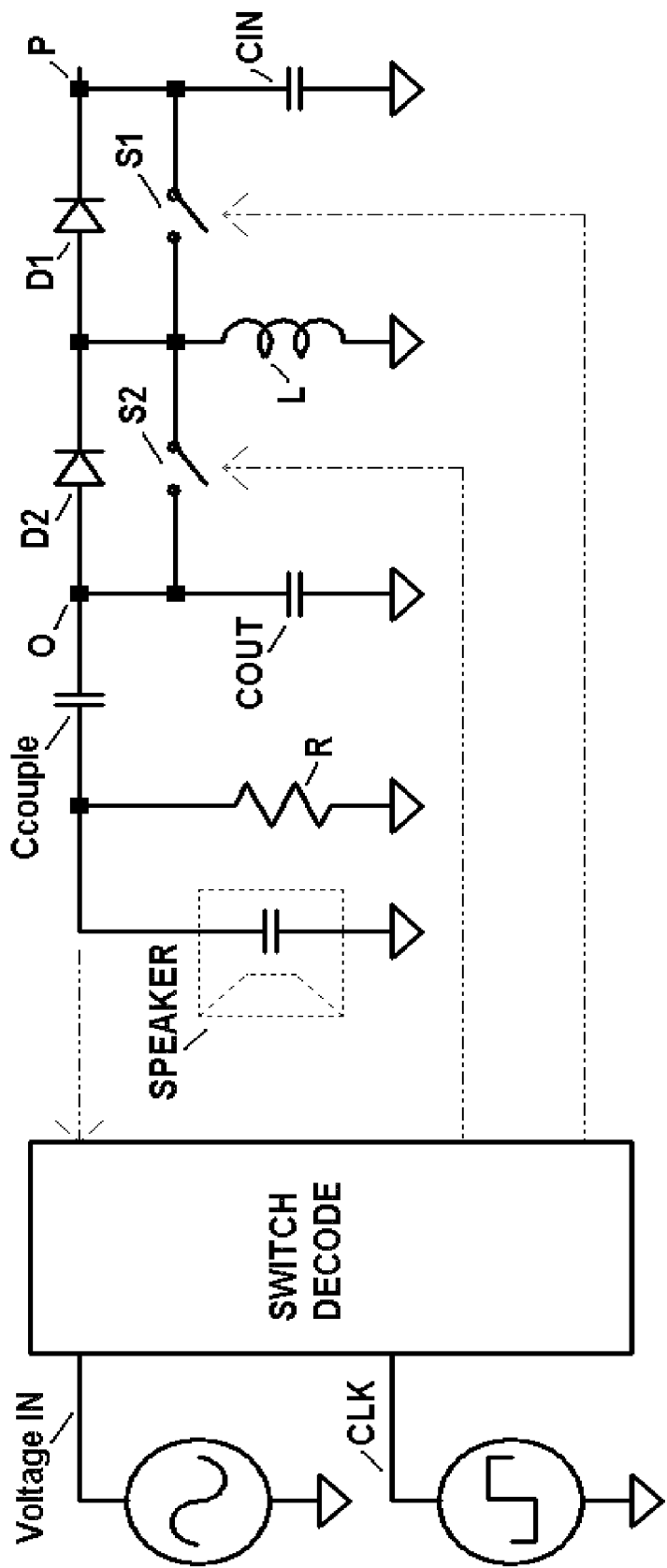
FIG. 2 shows an inverting, bidirectional, flyback amplifier driving a ground-referenced piezo speaker.

The amplifier of FIG. 2 is an inverting bidirectional flyback amplifier adapted for driving a ground-referenced piezo speaker, SPEAKER. Coupling capacitor, Ccouple, removes the DC offset voltage and resistor, R, centers the SPEAKER voltage on ground. Switches, S1 and S2, are connected as in FIG. 1 to power input, P, and the signal output, O. Inductor, L, diodes, D1 and D2, and capacitors, CIN and COUT, also correspond to those in FIG. 1. Responsive to Voltage IN, control block Switch Decode controls the switches, as in FIG. 1. The amplifier can be synchronous or asynchronous in operation. Here, a clock, CLK, is shown for synchronous operation. Predictive Energy Balancing control is employed in this topology to produce good audio fidelity without adding excessive unwanted harmonic content.

Figure 3:
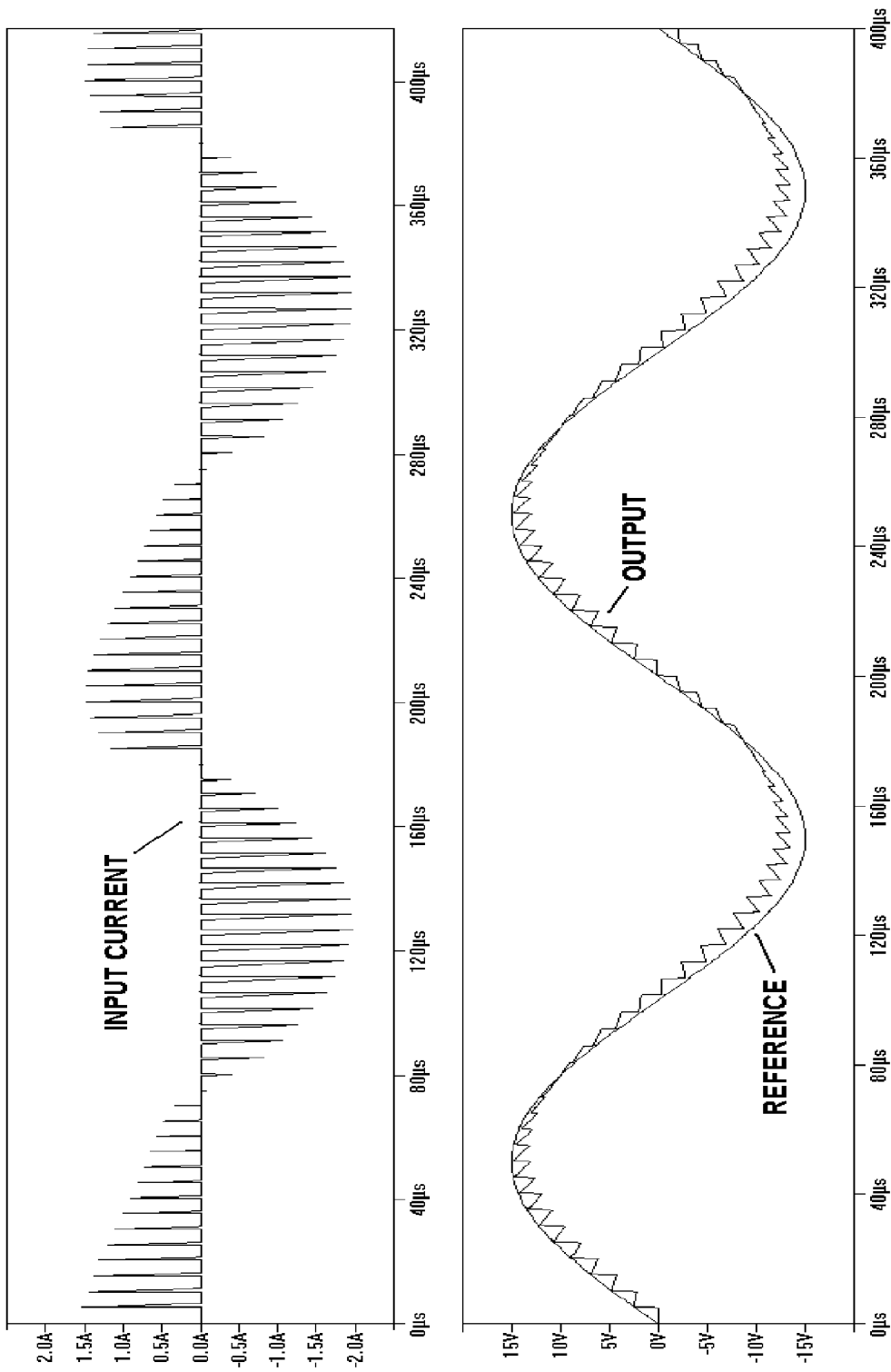
FIG. 3 shows SPICE waveforms illustrating the function of the amplifier of FIG. 2.

The waveforms of FIG. 3 were generated by a SPICE simulation of the amplifier of FIG. 2. The lower axis shows a REFERENCE voltage representing the ideal output voltage and the actual OUTPUT voltage. The reference is a +/−15 volt sine wave at 5 kHz. The output closely tracks the REFERENCE with the addition of some ripple at the clock frequency, which in this case is 200 kHz. The ripple will be inaudible since it is well outside the audio range. For a more ideal waveform, the ripple could be reduced either by adding a small post filter, by increasing the clock frequency, or by increasing the capacitance at the output.

The upper trace shows the INPUT CURRENT which is seen to be bidirectional. When the OUTPUT is pushed in the negative direction via Forward energy cycles, energy is drawn from the power input. When the OUTPUT is pulled in the positive direction via Reverse energy cycles, energy is returned to the power input. The bidirectionalty provides higher efficiency operation.

Figure 4:
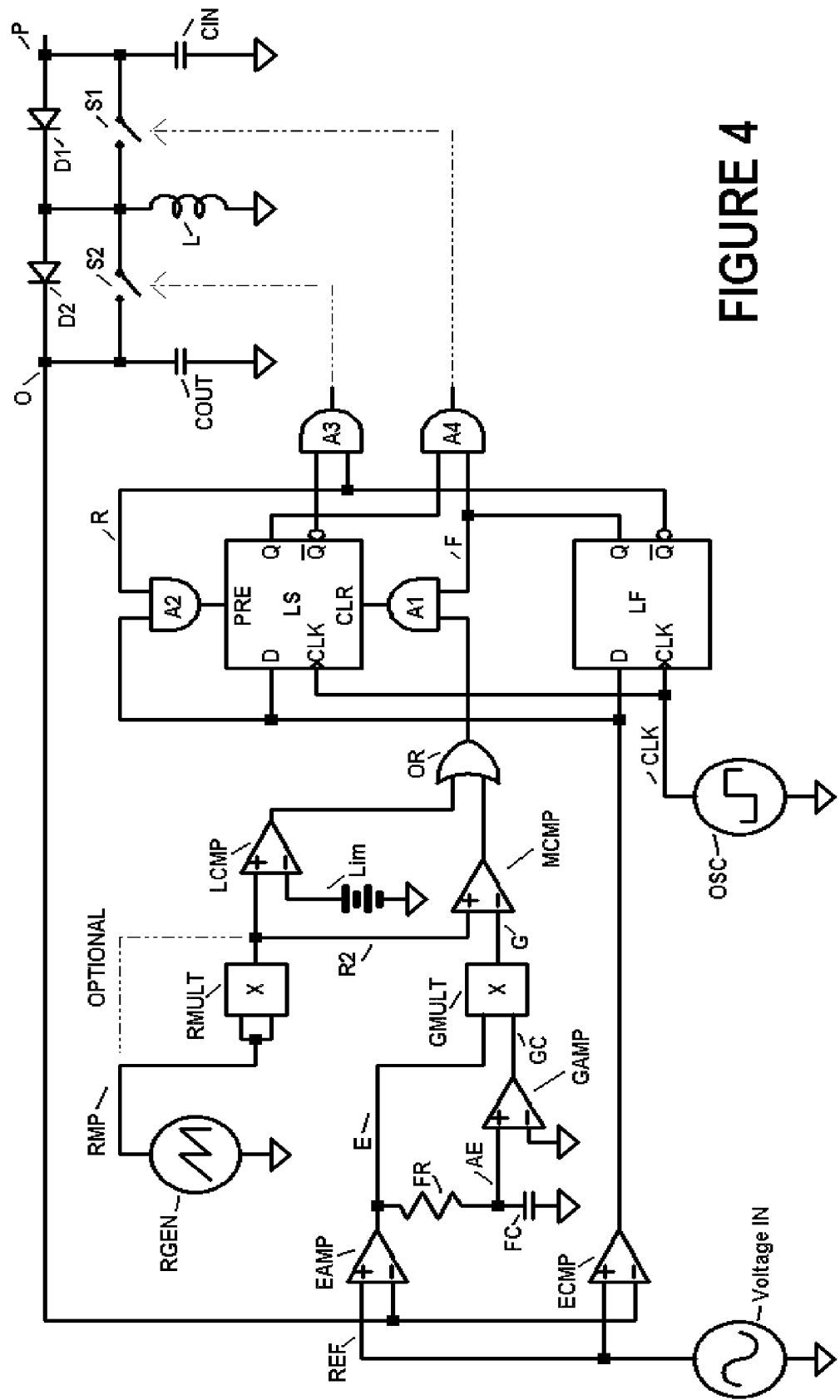
FIG. 4 is a block diagram for an implementation of the amplifier of FIG. 1.

FIG. 4 shows an inverting bidirectional flyback amplifier with control details included. The controls utilize adaptive gain to adjust the dynamic response. This example uses a negative power input, P, to produce a positive output, O. Switches, S1 and S2, and inductor, L, are connected as in FIG. 1. Diodes D1 and D2 are placed as in FIG. 1 but with reversed polarity. Capacitors CIN and COUT also correspond to those in FIG. 1.

The input signal, Voltage IN, connects to an input of a comparator, ECMP, The output voltage, O, connects to the other ECMP comparator input. The comparator output corresponds to the polarity of the instantaneous output error. That output is the data input for latches LF and LS. Both latches are clocked by CLK, the output of oscillator, OSC. Each control cycle is either a Forward cycle, indicated by control signal F, or a Reverse cycle, indicated by control signal R, based on the output of comparator ECMP. The input signal, Voltage IN, also connects to an input of an error amplifier, EAMP, which determines the differential error magnitude. The output signal, E, is scaled by multiplier, GMULT, and compared to a ramp signal, R2, by comparator MCMP. RGEN generates the ramp signal, RMP, which is squared by multiplier, RMULT. Optionally, that squaring function can be omitted. The ramp signal is compared to a current limit value, Lim, by comparator LCMP. If the limit is exceeded, then a clear signal passes through OR gate, OR, and AND gate, A1, to reset latch LS. Alternatively, a clear signal can instead pass through OR gate, OR, from the output of main comparator, MCMP. The clear signal is only active during Forward operation because AND gate A1 blocks the signal during Reverse operation.

In Forward operation, latches LS and LF begin each control cycle in the set condition. AND gate A4 turns on switch S1 when both LS and LF are set. As described above, latch LS is reset by a current limit or by the ramp rising above the scaled error signal. When LS is cleared, S1 opens and flyback energy flows through diode D2 to the output, O. The error signal, E, is averaged by filter resistor FR and filter capacitor FC to produce average error signal, AE. AE is fed to the input of gain amplifier, GAMP, to produce gain correction signal, GC, which connects to the second input of GMULT. The effect is for the feedback gain to increase or decrease, as needed, to bring the average error signal, E, toward zero. The time constant of the averaging filter formed by FR and FC should be many times the control cycle period to preserve dynamic response.

In Reverse operation, latches LS and LF begin each control cycle in the cleared state. AND gate A3 combines the latch LS, Qbar output with logic signal R to turn on switch S2. That causes inductor, L, to energize from output, O, drawing O toward zero until the output of comparator ECMP changes state at the regulation point. The output of ECMP acts through AND gate A2 to preset latch LS, thereby turning off switch S2 through AND gate A3. Flyback inductive energy then flows through diode D1 to return energy to the power input, P. The process repeats at the next clock, CLK.

Figure 6:
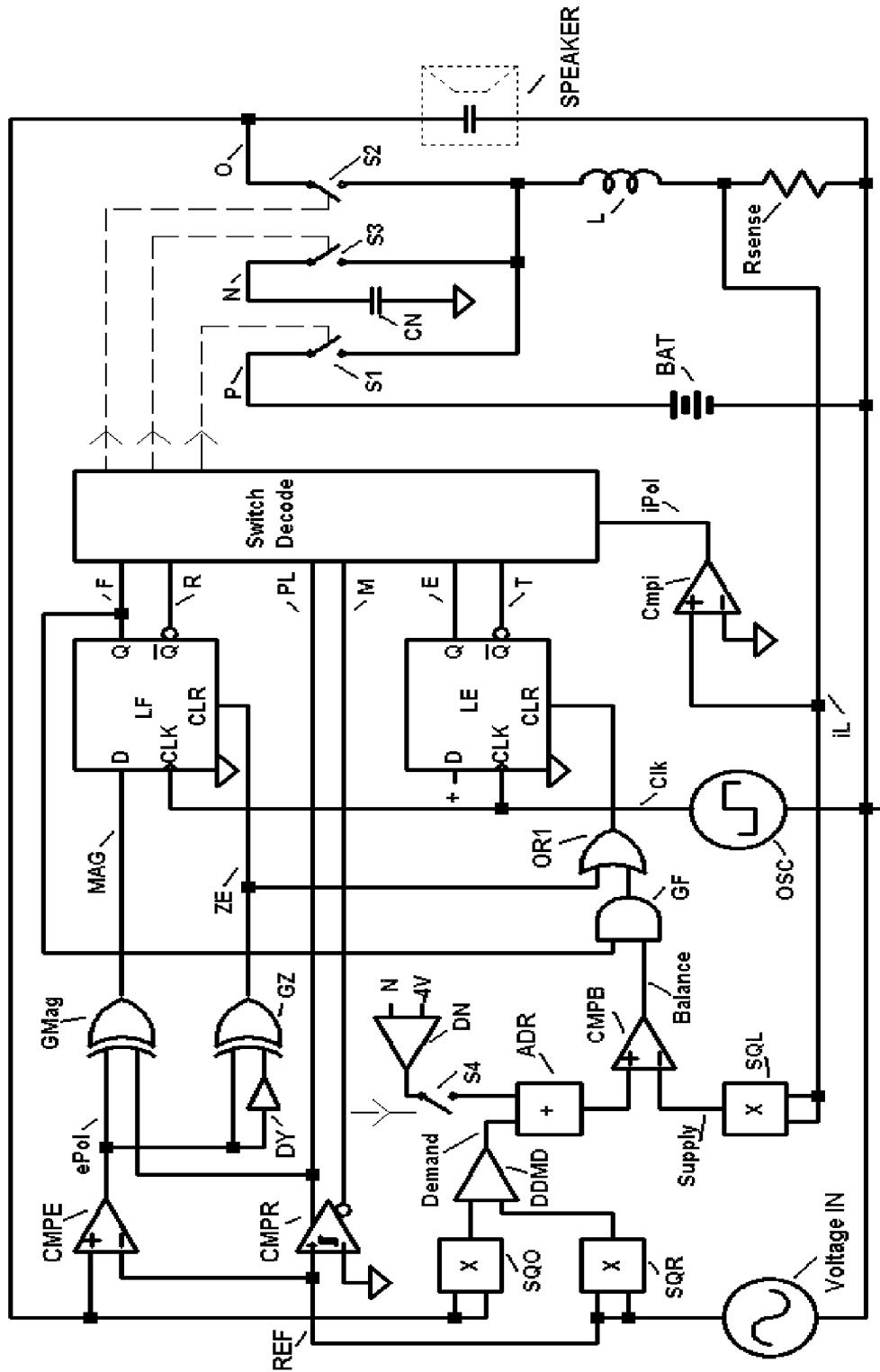
FIG. 6 is a block diagram for an implementation of the amplifier of FIG. 5.

With the addition of circuitry to detect conduction in inductor L, logic can be added to perform synchronous rectification using switches S1 and S2. The optional squaring function, RMULT, reduces the amount that gain correction signal, GC, changes to account for a range of voltages. That offers some of the benefit of Predictive Energy Balancing without needing to perform all the computations. With the addition of Predictive Energy Balancing, as shown in FIG. 6 below, the GC signal becomes essentially a DC setting. Note that by resistively dividing the feedback signal, the amplifier can be given the desired overall gain.

Figure 5:
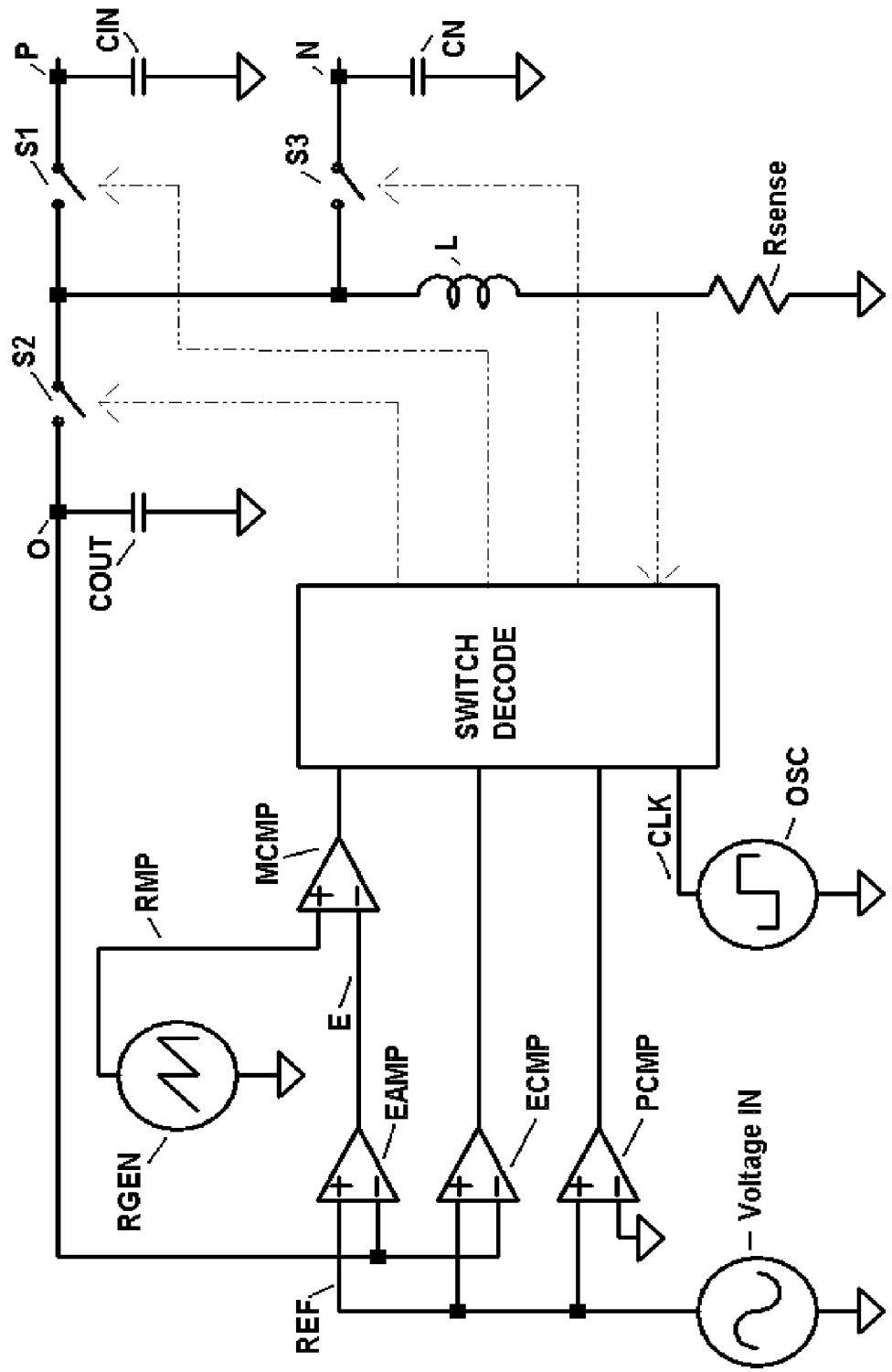
FIG. 5 shows a 3-switch bipolar bidirectional, flyback amplifier.

FIG. 5 shows a 3-switch variation of the flyback amplifier that is capable of bipolar, bidirectional operation. This configuration is desirable when a ground-referenced output is wanted without employing a coupling capacitor. This example uses positive, P, and negative, N, power inputs to produce a bipolar output, O. Switches, S1 and S2, and inductor L are connected as in FIG. 1. Capacitors CIN and COUT also correspond to those in FIG. 1. An additional switch, S3, connects to the junction of switches S1 and S2. The other end of switch S3 connects to power terminal, N, and to a filter capacitor, CN. In this example, all 3 switches are bidirectionally blocking.

Input power can be provided through both nodes P and N, or through only one or the other. The amplifier can generate its own oppositely-poled supply in much the same fashion as it generates an inverted output. For clarity, the following discussion of FIG. 5 assumes that a positive power input is provided at power terminal P, and a negative power input is provided at terminal N. Block SWITCH DECODE controls the switches, paced here by clock signal CLK, generated by oscillator, OSC. As before, an asynchronous version is also an option.

The input signal, REF, is provided by generator, Voltage IN. An error signal, E is produced by differential amplifier, EAMP. The output of EAMP is compared to a ramp signal, RMP, by comparator MCMP. Ramp signal, RMP, is produced by generator RGEN. Comparator ECMP determines the polarity of the error signal. Comparator PCMP determines the polarity of the reference signal. The switches respond to the outputs of the three comparators, the voltage developed across current sense resistor, Rsense, and to the clock. Forward cycles push the output away from zero, and Reverse cycles pull the output toward zero. Energy in either polarity is available for Forward Energize periods, and energy in either polarity from Reverse Energize periods can be returned to the appropriate power supply. Because the switches are bipolar blocking, synchronous rectification is employed to transfer energy. The cessation of current, as determined by the voltage at Rsense, controls termination of synchronous rectification during energy Transfer periods.

A variation on FIG. 6, where only switch S3 is bipolar-blocking, allows bipolar operation with the limitation that the output voltage remains between voltage N and voltage P.

FIG. 6 shows a bipolar bidirectional flyback amplifier driving a piezo speaker, and using Predictive Energy Balancing controls. Here, positive power is provided at node P, and the negative supply is self-generated at node N. Switches S1, S2, & S3, inductor, L, and sense resistor, Rsense, are the same as shown in FIG. 5. Node P is shown as a rechargeable battery, BAT. Capacitor, COUT, is replaced by a piezo speaker, SPEAKER. The input, REF, is provided by generator, Voltage IN. The Predictive Energy Balancing controls generate a supply term, Supply, and a demand term, Demand, that are compared by comparator CMPB which produces an output signal, Balance, used to terminate Forward energizing periods. Supply is the current sense signal, iL, developed across resistor, Rsense, as squared by multiplier SQL. Differential amplifier DDMD takes the difference between the input signal, REF, as squared by multiplier SQR, and the output, O, as squared by multiplier 500 to produce a signal, Demand. Demand is augmented by summing block, ADR, before connecting to comparator, CMPB. Demand is increased by the amount needed to support power terminal, N, as determined by difference amp, DN, which compares the voltage at N to a reference voltage, here, 4V. Demand is augmented only when the reference is negative, as determined by comparator CMPR. Minus signal, M, is active to close switch, S4, in order to add to the Demand term. AND gate GF blocks the Balance signal during Reverse cycles. OR gate, OR1, provides an alternative path for clearing latch, LE, whenever signal ZE is active. The instantaneous polarity of the error, ePol, is determined by comparator CMPE. Delay, DY, and XOR gate, GZ, form an edge detector that pulses ZE briefly active upon any change of state at ePol. XOR gate GMag inverts ePol if comparator CMPR determines that the reference is positive, as indicated by signal PL. The output of gate, GMag is magnitude signal, Mag. When Mag is active, a Forward cycle is indicated, meaning that the output moves away from zero volts. Mag is stored in latch, LF at the rising edge of CLK, the output of oscillator, OSC. Latch, LE, is unconditionally set at the beginning of every control cycle as signaled by CLK, because of a logic-high voltage, +, present at its data input. Comparator Cmpi determines the polarity of the inductor current, iL. producing a polarity signal, iPol. The control block, Switch Decode, responds to signals Forward, F, Reverse, R, Energize, E, Transfer, T, reference polarity signals Plus, PL and Minus, M, and the iPol signal to operate the switches.

Operation follows the description of FIG. 5 with one addition. If, during a Forward Transfer period, signal ZE should indicate that the regulation point has been reached, both latches, LF and LE are cleared, causing a Reverse Transfer period to be selected. Responsive to iPol, any remaining inductive energy is returned to the appropriately poled power rail. This mechanism allows the self-generation of the oppositely-poled supply through the augmentation of the Demand term when the output polarity matches the polarity of the self-generated power supply. If the gain of the Predictive Energy Balancing control loop is excessive, then, instead of causing overshoot at the output, excess inductive energy is returned to the input. In that fashion, this mechanism also allows the use of excess gain, in trade for an incremental reduction in efficiency. Therefore, at lowered efficiencies, imperfect current mode or PWM controls can be employed without introducing sub-harmonic distortion.

An intrinsic limit on the Demand term may serve to set the maximum inductor current, or other explicit current-limiting circuitry may be added. The current limit may be needed at start-up to protect the circuitry while any self-generated supply voltage is coming into regulation. Predictive Energy Balancing controls do not require a fixed clock frequency. The frequency can be lowered to save power, or increased to reduce ripple and increase bandwidth, or control cycles may be triggered asynchronously. Even the frequency for synchronous operation can be adjusted dynamically, if desired.

Figure 7:
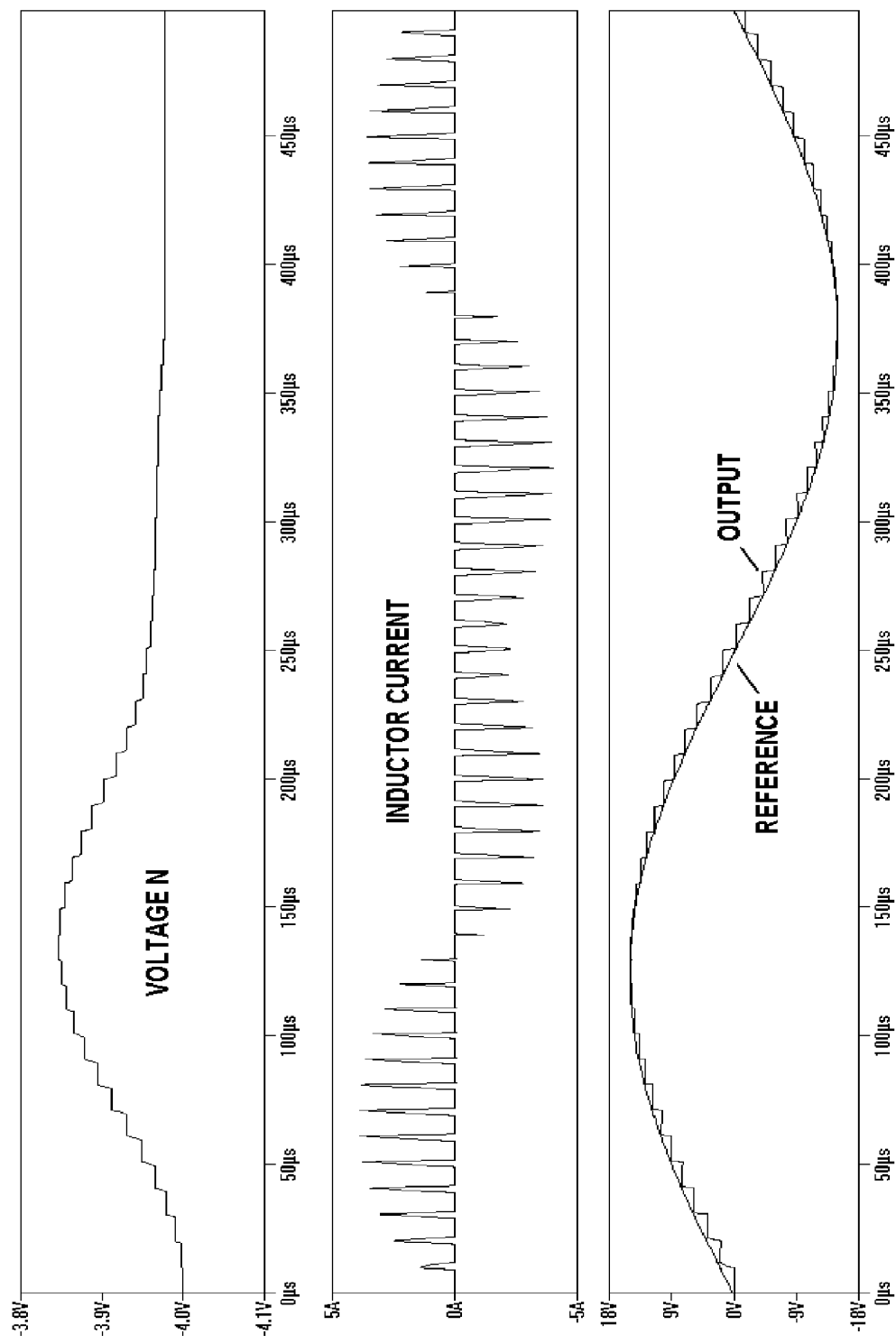
FIG. 7 shows SPICE waveforms illustrating the function of the amplifier of FIG. 6.

FIG. 7 shows SPICE waveforms of the amplifier of FIG. 6 in operation. The top trace is the self-generated power supply, VOLTAGE N. The voltage at capacitor CN is drawn down (toward zero) during Forward Energize periods. Energy is returned to capacitor CN during Reverse Transfer periods when the output is positive, causing voltage N to move in the negative direction. Because at least some energy is dissipated in the process, N is less negative after the discharge and charge periods. Because of the Demand augmentation controlled by amplifier DN in FIG. 6, the voltage at N regains the −4 volt regulation point during Forward cycles while the output is negative. In FIG. 7, that corresponds to the time between 250 and 375 microseconds.

The center waveform is the current in the switched inductor, INDUCTOR CURRENT. It shows a sinusoidal character at twice the reference input frequency, which in this case is 2 kHz with a clock frequency, CLK, of 100 kHz. The bottom axis shows the REFERENCE voltage and the OUTPUT voltages superimposed. As in earlier examples, only the ripple at the clock frequency distinguishes the two traces.

Figure 8:
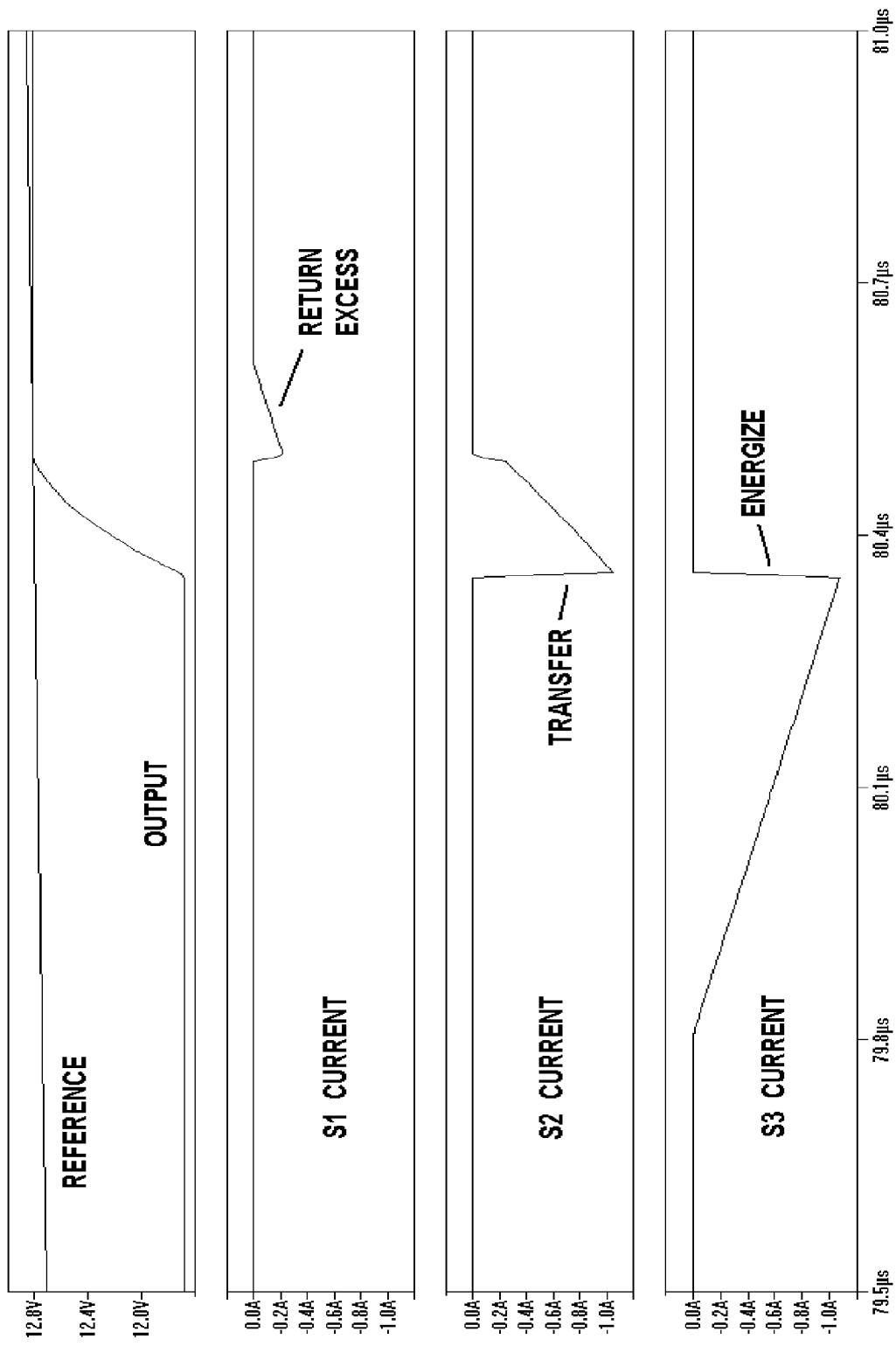
FIG. 8 shows a detail of the regulation of the amplifier of FIG. 5.

FIG. 8 shows a detail of the excess return mechanism. The current in switch S3, S3 CURRENT seen in the bottom trace shows a Forward ENERGIZE period. The current in switch S2, S2 CURRENT in the second trace up shows the Forward TRANSFER period. In the upper axis, note the OUTPUT rising to meet the REFERENCE during the period of Forward TRANSFER. That meeting begins a Reverse Transfer period. The second trace down, S1 CURRENT, shows the excess inductive energy, RETURN EXCESS being returned to node P. Again, this mechanism both improves regulation and enables the self-generation of the oppositely-poled supply.

Figure 9:
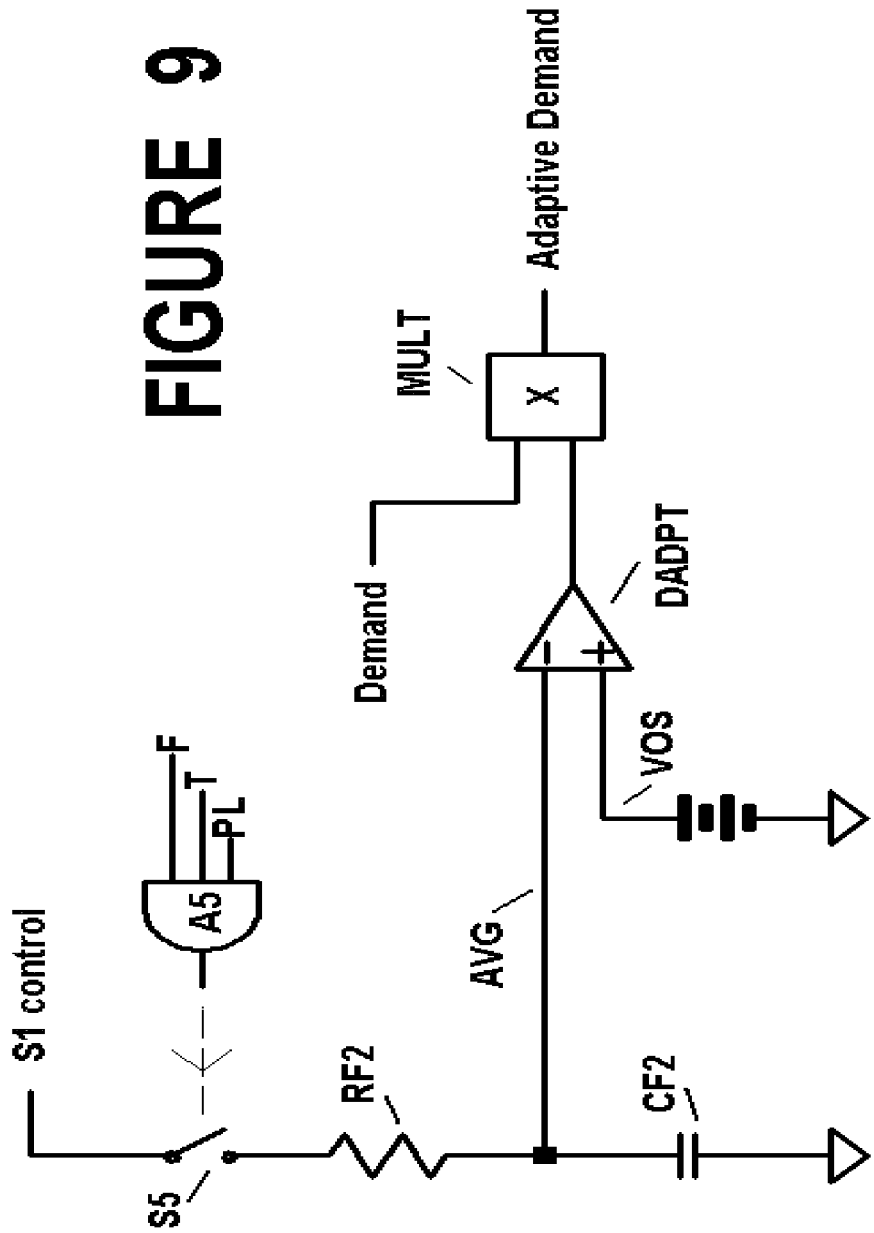
FIG. 9 is a block diagram of an adaptive gain control for the amplifier of FIG. 5.

FIG. 9 shows a means for adaptively adjusting the ratio gain of the amplifier shown in FIG. 6. Predictive Energy Balancing relies on the ratio of the switched inductance to the load capacitance to determine the energy balance point. If an additional capacitive load is added, or if one of multiple filter capacitors should fail in the open mode, then the ratio gain will be incorrect. Adaptive ratio gain can bring Predictive Energy Balancing back to near-ideal behavior even under such drastic circumstances. Adaptive gain is sometimes needed for PWM or current mode control schemes just to obtain reasonable performance under normal conditions because no single gain setting can cover a sufficient operational range.

Because excess ratio gain does not cause the output voltage to increase in the amplifier of FIG. 6, a conventional negative feedback circuit will not provide adaptive ratio gain control. Instead, during Forward, F, Transfer, T periods with a positive reference, PL, as gated by AND gate A5, the average value of the control for switch S1 is stored in capacitor CF2 through switch S5 and as filtered by resistor RF2. The time constant of the filter formed by RF2 and CF2 should be many control periods to obtain a long-term average. Under ideal circumstances, only occasionally would a small amount of excess energy be returned. That would cause voltage AVG to be a small, but non-zero amount, VOS. If AVG rises above threshold VOS, then the output of the difference amplifier DADPT will decrease, reducing the Demand term. If AVG falls below threshold VOS, then the output of difference amplifier DADPT will increase, increasing the Demand term. Multiplier MULT produces an output, Adaptive Demand, that represents the Demand as adjusted by the adaptive ratio gain. This circuit can be inserted into the converter of FIG. 6 to modulate the Demand signal. Then, feedback can drive AVG to match VOS.

Figure 10:
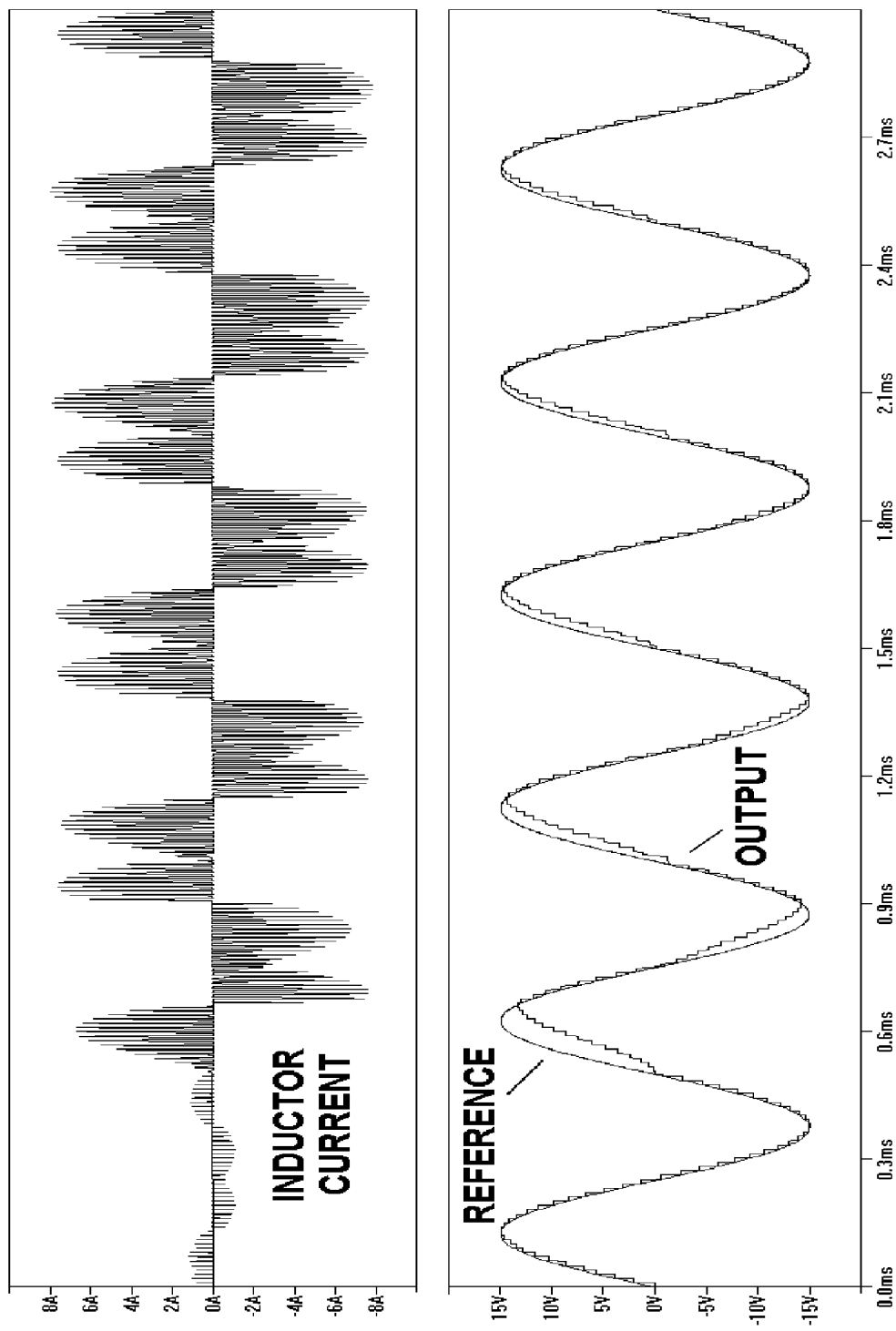
FIG. 10 shows the adaptive gain control of FIG. 9 in operation.

FIG. 10 shows SPICE waveforms demonstrating the function of the amplifier of FIG. 6 equipped with the adaptive ratio gain circuit of FIG. 9. At time 0.5 ms, the load capacitance is increased by a factor of 50, causing immediate, drastic under-regulation as seen in the overlaid REFERENCE and the OUTPUT waveforms on the lower axis. Over a period of several milliseconds, the ratio gain can be seen to be increasingly correcting for the disruption. After 10 or 20 ms, the ratio gain will be substantially stable at its new level. The upper axis shows the INDUCTOR CURRENT, seen to increase sharply when the extra capacitance is added, and to increase gradually as the adaptive ratio gain takes effect.

Figure 11:
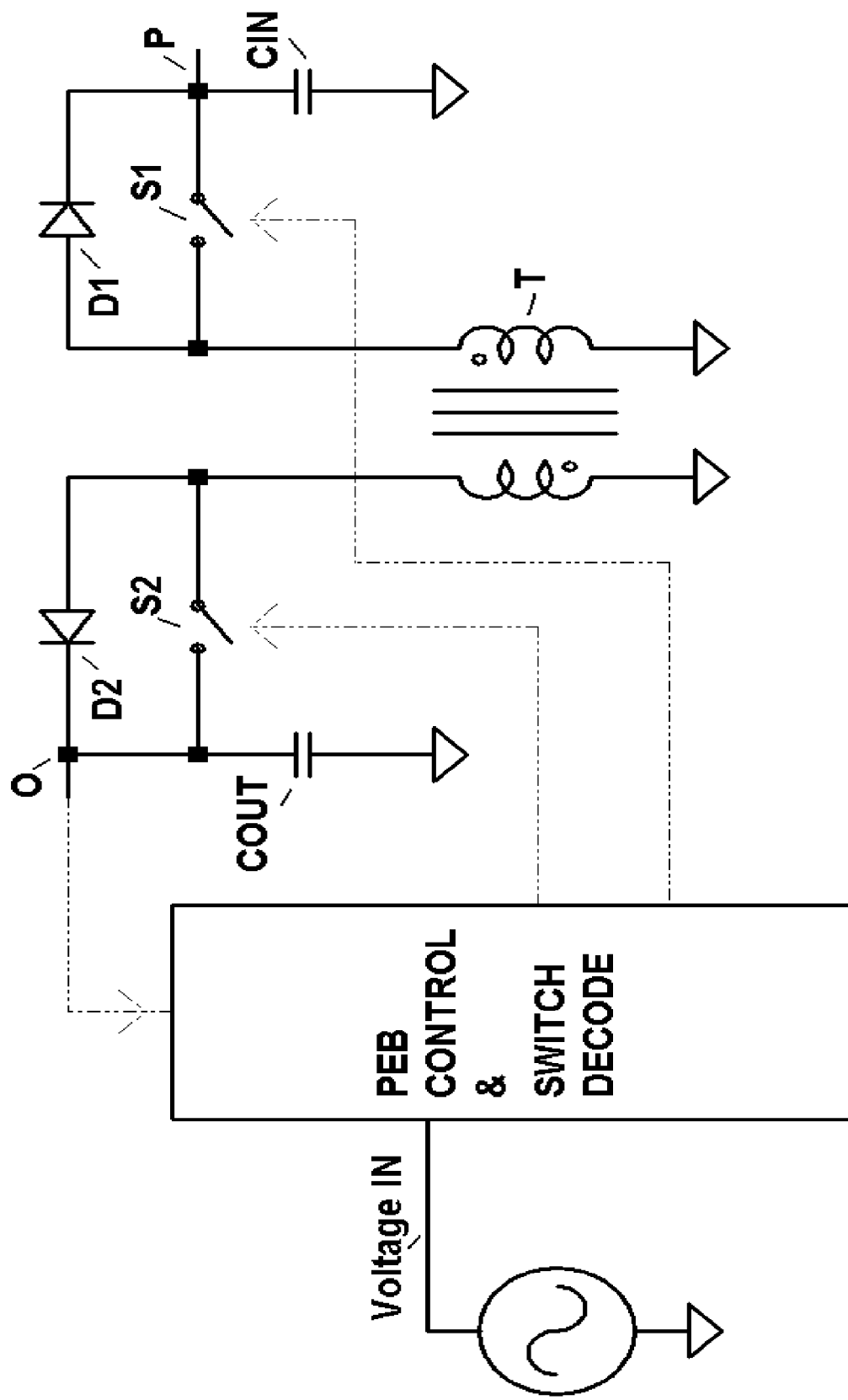
FIG. 11 shows a transformer-coupled Predictive Energy Balancing flyback amplifier.

FIG. 11 shows a transformer-coupled variation of the amplifier of FIG. 1. In this case, diode D1, switch S1 and capacitor CIN need have no DC connection to diode D2, switch S2 and capacitor COUT. Power input, P, is here a positive voltage. Transformer T replaces inductor L. If isolation is desired, then digital isolation can be employed for the signal controlling switch S1. Here, the transformer windings are oppositely-poled to produce a non-inverting output, O. With Predictive Energy Balancing (PEB) controls, PEB CONTROL & SWITCH DECODE, the amplifier output, O, will follow the reference, Voltage IN, with good fidelity in either synchronous or asynchronous operation.

In at least one embodiment, an inverting switched-mode bidirectional amplifier comprises a two-terminal switched inductor (L of FIG. 1) with one end at or near a common potential. The other end of inductor L connects to a switch (S1 of FIG. 1) connecting to a power input (P of FIG. 1) and to a second switch (S2 of FIG. 1) connecting to the output (O of FIG. 1) and where output and power input each have capacitance associated (CIN and COUT of FIG. 1). Output O is caused to follow an arbitrary reference input (Voltage IN of FIG. 1) through the adding or removing of output energy by performing flyback energy transfers in the appropriate direction.

At least one embodiment has an AC-coupled output for driving a speaker referenced to common (FIG. 2).

At least one embodiment has adaptive gain (FIG. 4).

At least one embodiment has some form of prediction to improve Forward control cycles (FIG. 4 with RMULT).

At least one embodiment has Predictive Energy Balancing.

At least one embodiment is a 3-switch version of the above, where a third switch is added to generate a power rail of opposite polarity to the input and all three switches are bidirectionally blocking (FIG. 6).

In at least one embodiment, only the output switch is bidirectionally blocking. The output is then bipolar vn<vout<vp.

At least one embodiment is a 3-switch version of the above including an optional extra transfer period after energy is transferred from input to output where any excess inductive energy is returned to the appropriately-poled power rail.

At least one embodiment is the 3-switch version above where the oppositely-poled power rail is regulated by placing a controlled quantity of excess energy in the inductor when the output is of like polarity and is to be increased in magnitude.

At least one embodiment is a 3-switch version of the above where PEB is used to regulate energy transfer from input to output.

At least one embodiment is a 3-switch version of the above with adaptive gain to adjust for dynamic conditions (FIG. 9).

In at least one embodiment, the bandwidth extends to DC.

At least one embodiment has PEB where a transformer is used in place of L (FIG. 11).

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Unless explicitly stated otherwise, each numerical value and range should be interpreted as being approximate as if the word "about" or "approximately" preceded the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

The invention claimed is:

1. A switched-mode amplifier comprising:
   an inductive element;
   a first switch;
   a second switch; and
   a controller, wherein:
      if the inductive element is a single inductor, then:
         (i) the inductive element, the first switch, and the second switch are all connected to a first shared node;
         (ii) the inductive element is connected between the first shared node and ground;
         (iii) the first switch is connected between the first shared node and a first power port of the amplifier;
         (iv) the second switch is connected between the first shared node and an output port of the amplifier;
      if the inductive element is a transformer comprising a primary inductor and a secondary inductor, then:
         (i) the primary inductor and the first switch are connected to a first shared node;
         (ii) the secondary inductor and the second switch are connected to a second shared node;
         (iii) the primary inductor is connected between the first shared node and ground;
         (iv) the secondary inductor is connected between the second shared node and ground;
         (v) the first switch is connected between the first shared node and a first power port of the amplifier; and (vi) the second switch is connected between the second shared node and an output port of the amplifier;

the controller is connected to a reference input port of the amplifier and configured to operate the first and second switches to perform bidirectional energy transfers as required to cause the output port to follow an arbitrary input voltage applied at the reference input port, wherein the reference input port is different from the first power port; and the controller is configured to select either a forward energy transfer or a reverse energy transfer at a start of a control cycle for the amplifier, wherein:

for the forward energy transfer, the controller is configured to operate the first and second switches to (i) energize the inductive element from a power port of the amplifier until the controller determines that a desired current or energy level is attained in the inductive element and then (ii) transfer energy from the inductive element to the output port; and for the reverse energy transfer, the controller is configured to operate the first and second switches to (i) energize the inductive element from the output port until the controller determines that a desired current or voltage level is attained at the output port and then (ii) transfer energy from the inductive element to a power port of the amplifier.

2. The amplifier of claim 1, wherein the controller performs Predictive Energy Balancing to improve amplifier fidelity when operating with a unipolar output voltage at the output port.

3. The amplifier of claim 2, wherein the output port is configured to be AC coupled to drive a piezo speaker with an audio signal applied at the reference input port.

4. The amplifier of claim 1, further comprising a third switch, wherein:

if the inductive element is the single inductor, then the third switch is connected between the first shared node and a second power port of the amplifier that is oppositely poled with respect to the first power port;

if the inductive element is the transformer, then the third switch is connected between the first or second shared node and a second power port of the amplifier that is oppositely poled with respect to the first power port; and the controller is configured to operate the first, second, and third switches to perform the bidirectional energy transfers as required to cause the output port to follow the arbitrary input voltage for both positive and negative polarities applied at the reference input port, wherein the reference input port is different from the first and second power ports.

5. The amplifier of claim 4, wherein the controller is configured to cause the inductive element to be energized from the first or second power port with an amount of energy determined to equal an energy requirement at the output port.

6. The amplifier of claim 4, wherein the controller is configured to cause an oppositely poled power supply voltage at the second power port to be self-generated by placing energy in the inductive element in excess of that required for regulation when the reference input port is oppositely poled from the first power port.

7. The amplifier of claim 4, wherein the controller is configured to achieve regulation by causing excess inductive energy to be returned to the first or second power port, wherein:

the inductive element is configured to be first charged with energy in excess of an amount required for regulation; and the controller is configured to control the first, second, and third switches such that (i) energy is then transferred to the output port as required for the regulation and (ii) remaining inductive energy is then transferred to the appropriately poled power port.

8. The amplifier of claim 7, wherein the controller is configured to perform adaptive control to minimize an average amount of returned excess energy.

9. The amplifier of claim 1, further comprising a sense resistor connected between the inductive element and ground.

10. The amplifier of claim 1, wherein the inductive element is a transformer configured to provide isolation between the first power port and the output port.

11. The amplifier of claim 1, wherein the controller is connected to receive a feedback signal from the output port and configured to use the feedback signal to operate the first and second switches to perform the bidirectional energy transfers.

12. The amplifier of claim 1, wherein:

the input voltage is a time-varying voltage; and the controller is connected to the reference input port of the amplifier and configured to operate the first and second switches to perform the bidirectional energy transfers as required to cause the output port to follow the time-varying voltage applied at the reference input port.

13. The amplifier of claim 1, wherein the inductive element is the single inductor.

14. The amplifier of claim 4, wherein:

for the forward energy transfer, the controller is configured to operate the first, second, and third switches to energize the inductive element from the first or second power port to the desired current or energy level in the inductive element; and for the reverse energy transfer, the controller is configured to operate the first, second, and third switches to energize the inductive element from the output port to the desired current or voltage level at the output port.

15. The amplifier of claim 1, wherein the controller is configured to select the forward energy transfer or the reverse energy transfer based on a comparison between (i) a magnitude of an instantaneous voltage or current at the output port and (ii) a reference voltage or current at the reference input port.

16. The amplifier of claim 1, wherein:

the inductive element is a single inductor having a first terminal and a second terminal;

the first terminal of the inductor is connected to the first shared node; and no switches are connected to the second terminal of the inductor.

17. The amplifier of claim 1, wherein:

the inductive element is a single inductor having a first terminal and a second terminal;

the first terminal of the inductor is connected to the first shared node; and the second terminal of the inductor is not configured to be connected to either the first power port or the output port.

18. The amplifier of claim 1, wherein:

the inductive element is the transformer;

the primary inductor has a first terminal and a second terminal;

the secondary inductor has a first terminal and a second terminal;
the first terminal of the primary inductor is connected to the first shared node;
the first terminal of the secondary inductor is connected to the second shared node;
no switches are connected to the second terminal of the primary inductor; and
no switches are connected to the second terminal of the secondary inductor.

19. The amplifier of claim 1, wherein:
the inductive element is the transformer;
the primary inductor has a first terminal and a second terminal;
the secondary inductor has a first terminal and a second terminal;
the first terminal of the primary inductor is connected to the first shared node;
the first terminal of the secondary inductor is connected to the second shared node;
the second terminal of the primary inductor is not configured to be connected to either the first power port or the output port; and
the second terminal of the secondary inductor is not configured to be connected to either the first power port or the output port.

20. The amplifier of claim 1, wherein the controller is configured to operate the first and second switches so as to terminate energize periods based on an instantaneous state of the amplifier.

* * * * *